US011607716B1

(12) United States Patent
Mark et al.

(10) Patent No.: US 11,607,716 B1
(45) Date of Patent: Mar. 21, 2023

(54) SYSTEMS AND METHODS FOR CHUCK CLEANING

(71) Applicant: KLA Corporation, Milpitas, CA (US)

(72) Inventors: Shai Mark, Kibutz Snir (IL); Mor Azaria, Migdal Ha'emek (IL); Yoram Uziel, Milpitas, CA (US); Giampietro Bieli, Santa Clara, CA (US); Adi Pahima, Migdal Ha'emek (IL)

(73) Assignee: KLA Corporation, Milpitas, CA (US)

( * ) Notice: Subject to any disclaimer, the term of this patent is extended or adjusted under 35 U.S.C. 154(b) by 268 days.

(21) Appl. No.: 17/021,932

(22) Filed: Sep. 15, 2020

Related U.S. Application Data

(60) Provisional application No. 63/042,588, filed on Jun. 23, 2020.

(51) Int. Cl.
*B08B 6/00* (2006.01)
*H01L 21/683* (2006.01)
*H01L 21/68* (2006.01)
*B08B 15/04* (2006.01)
*H01L 21/687* (2006.01)

(52) U.S. Cl.
CPC ................ *B08B 6/00* (2013.01); *B08B 15/04* (2013.01); *H01L 21/68* (2013.01); *H01L 21/6833* (2013.01); *H01L 21/68742* (2013.01); *B08B 2215/00* (2013.01)

(58) Field of Classification Search
CPC ....... B08B 6/00; B08B 15/04; B08B 2215/00; H01L 21/68; H01L 21/6833; H01L 21/68742
USPC ........................................................ 361/234
See application file for complete search history.

(56) References Cited

U.S. PATENT DOCUMENTS

| 5,410,122 A | 4/1995 | Su et al. |
| 5,584,938 A | 12/1996 | Douglas |
| 5,671,119 A | 9/1997 | Huang et al. |
| 5,946,184 A | 8/1999 | Kanno et al. |
| 6,295,194 B1 | 9/2001 | Sun et al. |
| 6,786,222 B2 | 9/2004 | Frisa et al. |

(Continued)

FOREIGN PATENT DOCUMENTS

| CN | 102485356 A | 6/2012 |
| CN | 103920686 B | 3/2016 |

(Continued)

OTHER PUBLICATIONS

JP-2006-032427; Publication date: Feb. 2, 2006; Title: Substrate processing apparatus and cleaning method of electrostatic chuck; Drawings and specification (Year: 2006).*

(Continued)

*Primary Examiner* — Dharti H Patel
(74) *Attorney, Agent, or Firm* — Suiter Swantz pc llo

(57) ABSTRACT

A cleaning assembly may include a chuck. The cleaning assembly may include a plurality of lift pins positioned proximate to the chuck. The plurality of lift pins may be configured to engage a cleaning substrate and translate the cleaning substrate to allow the cleaning substrate to capture one or more particles from the surface of the chuck via at least one of electrostatic attraction or mechanical trapping when the cleaning substrate is positioned in the second position. The cleaning assembly may include a replaceable top skin coupled to the chuck and configured to capture the one or more particles.

39 Claims, 10 Drawing Sheets

(56) References Cited

U.S. PATENT DOCUMENTS

| | | |
|---|---|---|
| 7,583,491 B2 | 9/2009 | Peitzsch |
| 8,236,109 B2 | 8/2012 | Moriya et al. |
| 8,316,867 B2 * | 11/2012 | Jennings ............. H01L 21/6831 |
| | | 414/744.1 |
| 8,454,758 B2 | 6/2013 | Akiba |
| 8,559,001 B2 | 10/2013 | Chang et al. |
| 8,749,149 B2 | 6/2014 | Naruo et al. |
| 8,941,336 B1 | 1/2015 | Liu et al. |
| 9,001,489 B2 | 4/2015 | Boyd, Jr. et al. |
| 9,170,209 B1 | 10/2015 | Chang et al. |
| 10,177,020 B2 | 1/2019 | Brain |
| 2002/0141132 A1 * | 10/2002 | Lin ..................... H01L 21/6831 |
| | | 279/128 |
| 2003/0180459 A1 | 9/2003 | Redeker et al. |
| 2004/0047720 A1 * | 3/2004 | Lerner .................. H01L 21/68 |
| | | 414/781 |
| 2006/0162739 A1 | 7/2006 | Sogard |
| 2010/0208409 A1 * | 8/2010 | Bluck .................. H01L 21/683 |
| | | 361/234 |
| 2019/0295874 A1 | 9/2019 | Bieli et al. |
| 2020/0126752 A1 | 4/2020 | Brodie |

FOREIGN PATENT DOCUMENTS

| | | |
|---|---|---|
| EP | 0790642 A2 | 8/1997 |
| EP | 0971391 A3 | 10/2002 |
| JP | H06173041 A | 6/1994 |
| JP | H11233605 A | 8/1999 |
| JP | 2002280365 A | 9/2002 |
| JP | 2006032427 A | 2/2006 |
| JP | 2009182222 B | 5/2012 |
| WO | 2019158380 A1 | 8/2019 |

OTHER PUBLICATIONS

JP-2009-182222; Publication date: Aug. 13, 2009; Substrate cleaning apparatus, substrate cleaning method, program and computer storage medium; Drawings and entire specification (Year: 2009).*

PCT International Search Report and Written Opinion for International Application No. PCT/US2021/037528 dated Oct. 7, 2021, 6 pages.

U.S. Appl. No. 16/682,814, filed Nov. 13, 2019, Azaria.

U.S. Appl. No. 16/564,981, filed Sep. 9, 2019, Yati.

* cited by examiner

SYSTEMS AND METHODS FOR CHUCK CLEANING

CROSS-REFERENCE TO RELATED APPLICATIONS

The present application claims the benefit under 35 U.S.C. § 119(e) of U.S. Provisional Patent Application Ser. No. 63/042,588, filed Jun. 23, 2020, titled SELF CLEAN AND REPLACEABLE SKIN PEDESTAL FOR SEMI TOOLS WITH AUTOMATED PARTICLE CONTAMINATE ANALYSIS, naming Shai Mark, Mor Azaria, Yoram Uziel, Giampietro Bieli, and Adi Pahima as inventors, which is incorporated herein by reference in the entirety.

TECHNICAL FIELD

The present invention generally relates to chuck cleaning, and, more particularly, to systems and methods for chuck cleaning.

BACKGROUND

Process chambers may include chucks. Cleaning of the chucks may be required due to the presence of particles in the process chambers. The particles may cause non-uniform contact with the chuck of the given process sub-system. Chuck cleaning is often performed by opening the process sub-system and using manual cleaning processes. Manual cleaning processes and subsequent machine setup processes may require considerable downtime and complex pre-calibration and/or post-calibration processes.

As such, it would be advantageous to provide a system and method to remedy the shortcomings of the approaches identified above.

SUMMARY

A cleaning assembly is disclosed, in accordance with one or more embodiments of the present disclosure. In one embodiment, the cleaning assembly includes a chuck. In another embodiment, the cleaning assembly includes a plurality of lift pins positioned proximate to the chuck. In another embodiment, the plurality of lift pins are configured to engage a cleaning substrate in a first position above a surface of the chuck. In another embodiment, the plurality of lift pins are configured to translate the cleaning substrate between the first position and a second position above the surface of the chuck. In another embodiment, the second position of the cleaning substrate is closer to the surface of the chuck than the first position of the cleaning substrate. In another embodiment, the cleaning substrate is configured to capture one or more particles from the surface of the chuck via at least one of electrostatic attraction or mechanical trapping when the cleaning substrate is positioned in the second position.

A method is disclosed, in accordance with one or more embodiments of the present disclosure. In one embodiment, the method may include, but is not limited to, receiving a cleaning substrate in a first position above a surface of a chuck with a plurality of lift pins. In another embodiment, the method may include, but is not limited to, translating the cleaning substrate to a second position above the surface of the chuck from the first position via the plurality of lift pins. In another embodiment, the second position of the cleaning substrate is closer to the surface of the chuck than the first position of the cleaning substrate. In another embodiment, the method may include, but is not limited to, capturing one or more particles from the surface of the chuck by the cleaning substrate via at least one of electrostatic attraction or mechanical trapping when the cleaning substrate is in the second position. In another embodiment, the method may include, but is not limited to, translating the cleaning substrate to the first position after the capturing the one or more particles from the chuck by the cleaning substrate.

A cleaning assembly is disclosed, in accordance with one or more embodiments of the present disclosure. In one embodiment, the cleaning assembly includes a chuck. In another embodiment, the cleaning assembly includes a replaceable top skin coupled to the chuck. In another embodiment, the replaceable top skin is configured to capture one or more particles. In another embodiment, the replaceable top skin is removable by the handling device. In another embodiment, the one or more particles are analyzable by a characterization sub-system following an actuation of the handling device to the characterization sub-system.

A method is disclosed, in accordance with one or more embodiments of the present disclosure. In one embodiment, the method may include, but is not limited to, removing a replaceable top skin from a chuck via a handling device. In another embodiment, the replaceable top skin is configured to capture one or more particles. In another embodiment, the replaceable top skin is removable by a handling device. In another embodiment, the one or more particles are analyzable by a characterization sub-system following an actuation of the handling device to the characterization sub-system.

A system is disclosed, in accordance with one or more embodiments of the present disclosure. In one embodiment, the system includes a chuck. In another embodiment, the system includes at least one chuck cleaning assembly configured to remove one or more particles from a surface of the chuck via at least one cleaning process. In another embodiment, the system includes a characterization sub-system configured to analyze the one or more particles. In another embodiment, the system includes a handling device configured to transfer the one or more particles to the characterization sub-system.

A method is disclosed, in accordance with one or more embodiments of the present disclosure. In one embodiment, the method may include, but is not limited to, performing at least one chuck cleaning process to capture one or more particles on a chuck. In another embodiment, the method may include, but is not limited to, transferring the captured one or more particles to a characterization sub-system. In another embodiment, the method may include, but is not limited to, analyzing the captured one or more particles with the characterization sub-system.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
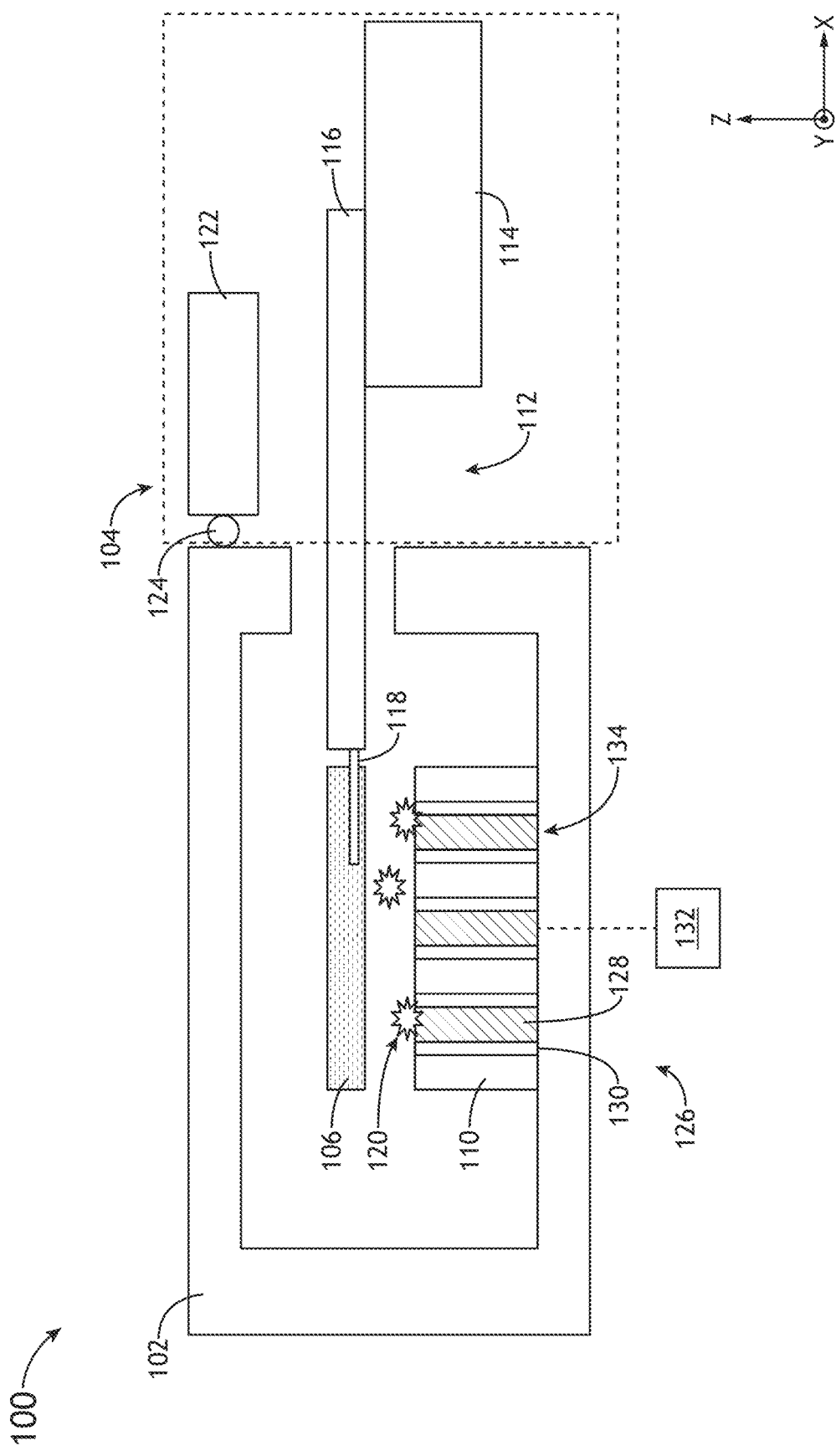
FIG. 1A illustrates a simplified schematic view of a process chamber depicting processing of a wafer, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Process chambers may include chucks. Cleaning of the chucks may be required due to the presence of particles in the process chambers. The particles may be introduced into the process chamber in a variety of ways. For instance, contaminant particles may be created through the accumulation of matter used by the process sub-system on the walls of the process chamber, and particulate matter from this material may then fall from the process chamber walls during processing. In addition, outside particles may be carried into a process chamber on an outside object such as a wafer. The particles may cause non-uniform contact of the wafer with the chuck of the given process sub-system. For example, the non-uniform contact may result in non-uniform temperature and/or pressure levels, overlay, critical dimension (CD) characterizing, or the like during processing of the wafer.

Chuck cleaning is often performed by opening the process sub-system and using manual cleaning processes. The manual cleaning processes may require the chuck to be manually cleaned using a tissue or brush. In such cases, the cleaning process requires a machine shutdown, purging of the vacuum, and cooling down of the process sub-system (e.g., as the process sub-system may be operating in excess of 320 degrees Celsius (° C.). In addition, access to the chuck is very limited and the process chamber cover may need to be opened in order to reach the chuck of the given process sub-system. This manual cleaning process and machine setup process often requires considerable downtime and complex pre-calibration and/or post-calibration processes.

Embodiments of the present disclosure are directed to systems and methods for chuck cleaning. More particularly, the present disclosure is directed to systems including a lift pin mechanism for accepting cleaning substrates and a replaceable top skin suitable for cleaning particles from process sub-system chucks. In addition, the present disclosure is directed to methods of cleaning particles from a process sub-system using the lift pin mechanism or the replaceable top skin.

The systems and methods presented herein should be compatible with existing process sub-systems and characterization sub-systems. The systems and methods presented herein should not be limited by temperature and/or pressure). The systems and methods presented herein should not have a duration within a process chamber of the process sub-system (e.g., limited by temperature and/or pressure)).

The systems and methods presented herein should not require a dissembling a process sub-system for cleaning.

Figure 1B:
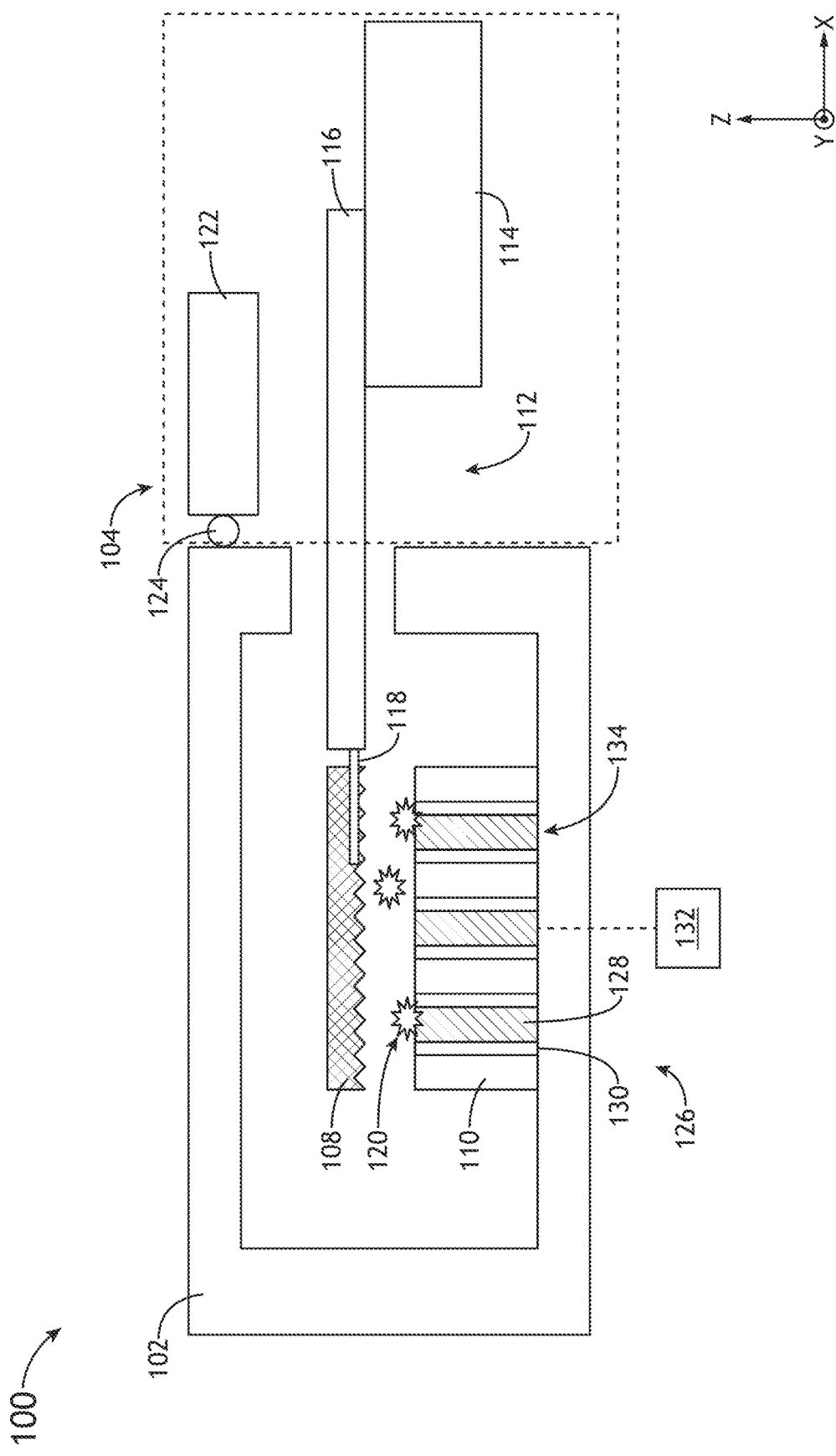
FIG. 1B illustrates a simplified schematic view of a process chamber depicting processing of a wafer, in accordance with one or more embodiments of the present disclosure.
Figure 1C:
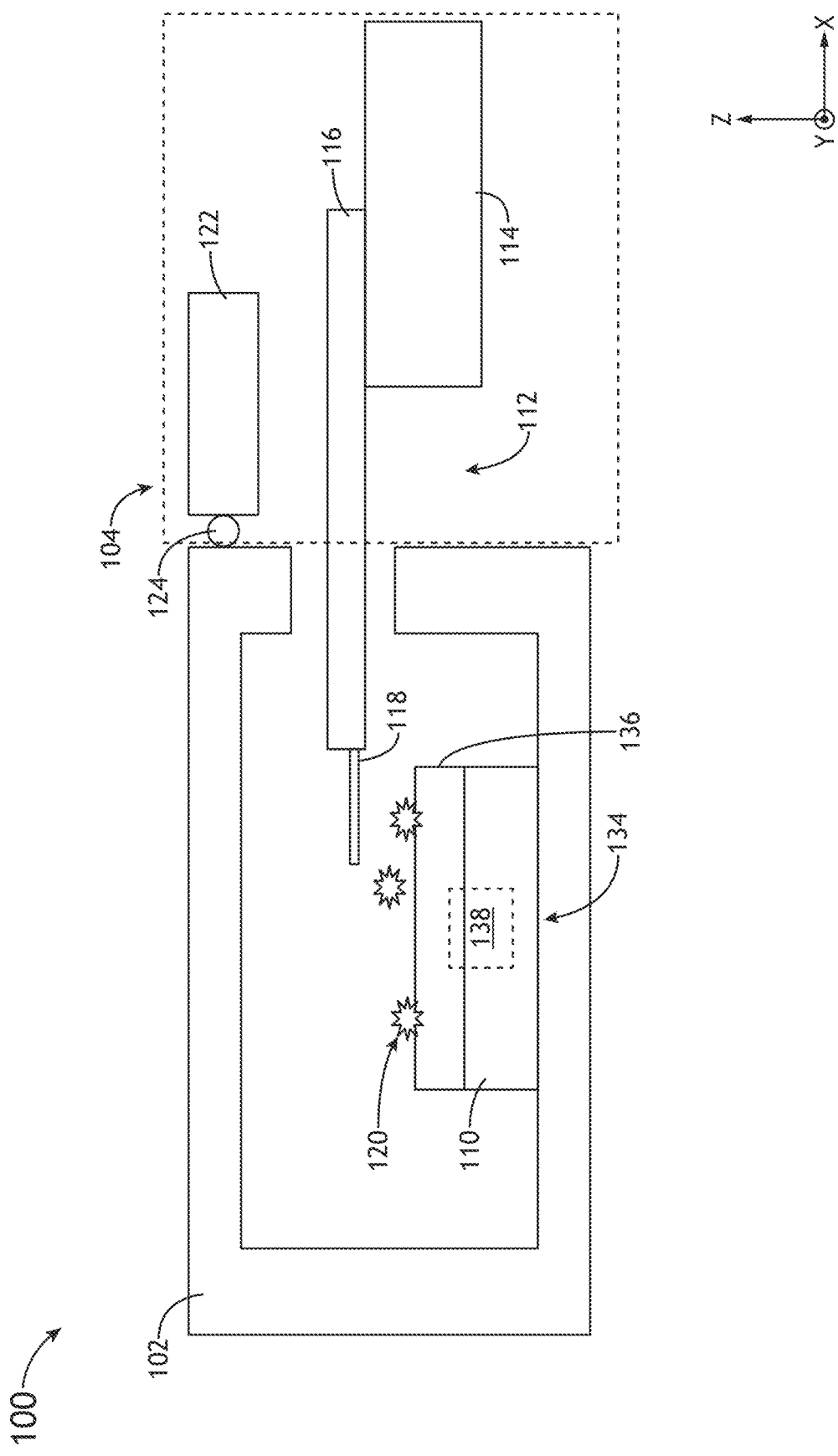
FIG. 1C illustrates a simplified schematic view of a process chamber depicting processing of a wafer, in accordance with one or more embodiments of the present disclosure.

FIG. 1A-1C in general illustrate a simplified schematic view of a process sub-system 100 including a process chamber 102, in accordance with one or more embodiments of the present disclosure.

In one embodiment, the process sub-system 100 includes one or more process chambers 102 configured to perform one or more semiconductor fabrication processes. For example, the one or more semiconductor fabrication processes may include, but are not limited to, one or more lithographic processes such as substrate preparation, spin coating, pre-bake processes, exposure processes, post-exposure baking processes, development processes, post-bake processes, or the like. For instance, the one or more lithographic processes may include, but are not limited to, patterning processes, etching processes, stripping processes, annealing processes, chemical mechanical planarization (CMP) processes, or the like. By way of another example, the one or more semiconductor fabrication processes may include, but are not limited to, one or more film deposition processes. For example, the one or more film deposition processes may include, but are not limited to, chemical vapor deposition (CVD) processes, physical vapor deposition (PVD) processes, or the like. It is noted herein that the process sub-system 100 may include one or more process chambers 102 with the same capabilities (e.g., perform the same fabrication process) in order to enhance the throughput or one or more process chambers 102 with different capabilities (e.g., perform different fabrication processes).

It is noted herein that the conditions of the process chamber 102 may vary. For example, the process chamber 102 may have a temperature and/or pressure) between 180° C. and 700° C. For instance, during CVD, the process chamber 102 may have a temperature and/or pressure) between 420° C. and 520° C. In another instance, during etch, the process chamber 102 may have a temperature and/or pressure) of at least 180° C. By way of another example, the process chamber 102 may have a vacuum level between 0.1 milliTorr (mTorr) and 420 mTorr at base pressure. By way of another example, the process chamber 102 may have a vacuum level between 0.5 mTorr and 100 Torr at process pressure. For instance, during CVD, the process pressure may be 2.0-10.0 Torr for 95% of the time and during 5% of the time it may be no more than 100 Torr. In another instance, during etch, the process pressure may be 0.5-400 mTorr for 95% of the time and during 5% of the time it may be no more than 400 mTorr.

In another embodiment, the process sub-system 100 includes a handling device 104 configured to transport (e.g., deliver) at least one of a wafer 106 or the cleaning substrate 108 to a chuck 110 in the one or more process chambers 102 via a robotic assembly 112. For example, the chuck 110 may include, but is not limited to, a vacuum-based chuck, a gravity-based chuck, or an electrostatic chuck. In general, the chuck 110 may be any chuck usable in any type of process sub-system (e.g., process tool, or the like) and/or any type of characterization sub-system (e.g., characterization tool such as a review tool, inspection tool, or the like), as described throughout the disclosure. In addition, in general the chuck 110 may be usable in any device suitable for securing or storing a sample such as a wafer before, during, or after any processing step, any characterizing step, or the like, as described throughout the disclosure. It is noted herein the "chuck 110" may be considered a "process plate" or a "plate," for purposes of the disclosure.

It is noted herein that "cleaning substrate" and "substrate" may be considered equivalent, for purposes of the present disclosure. In addition, it is noted herein an example embodiment of the cleaning substrate 108 is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is incorporated herein by reference in the entirety.

It is noted herein that the process chamber 102 may be configured to hold any dimension of wafer 106 and/or cleaning substrate 108. For example, the process chamber 102 may be configured to hold a wafer 106 and/or a cleaning substrate 108 that has a height between 0.5 millimeter (mm) and 10 mm. For instance, the wafer 106 and/or cleaning substrate 108 may have a height of 3.0 mm.

In another embodiment, the robotic assembly 112 includes a robot 114 and an end effector 116. In another embodiment, the end effector 116 includes a hand 118 in order to remove and insert at least one of the wafer 106 or the cleaning substrate 108 into the one or more process chambers 102. For example, the hand 118 may be configured to insert the wafer 106 into the one or more process chambers 102, such that the one or more process chambers 102 can begin the one or more semiconductor fabrication processes. By way of another example, the hand 118 may be configured to insert the cleaning substrate 108 into the one or more process chambers 102 after the chuck 110 contains one or more particles 120 to begin the cleaning processes described herein. In general, the hand 118 may be a set of grippers or a platform configured to interact with a side, edge, or bottom of at least one of the wafer 106 (e.g., as illustrated in at least FIG. 1A) or the cleaning substrate 108 (e.g., as illustrated in at least FIG. 1B).

The one or more particles 120 may be any size known in the art. For example, the one or more particles may between 0-1.0 μm. For instance, the one or more particles may be 0.019 μm. Further, it is noted herein that the one or more particles 120 may be any type of particle known in the art, including but not limited to, airborne molecule contamination (AMC), metal, or the like. For example, the one or more particles 120 may be metal (Al, Cu, or the like), fluorinated rubber (e.g., o-ring), grease, metal oxide, oxide film, bare silicon (Si), thermal oxide, nitride film, PR, Si, fluorine deposition, quartz, or the like.

It is noted herein the process chamber 102 may have various chemical residues on the walls of the process chamber 102. For example, during CVD, the chamber walls may have a halide residue (e.g., HCl, HI, F, or the like). By way of another example, during etching, the chamber wall may have residue containing at least one of: C, O, F, Al, Y, Fe, Na, Ti, Zr, or the like.

In another embodiment, the handling device 104 includes a gate 122. In another embodiment, the gate 122 includes an actuator 124 configured to open and close the gate 122. For example, the actuator 124 may open the gate 122 when the robotic assembly 112 is prepared to remove and/or insert at least one of the wafer 106 or the cleaning substrate 108. By way of another example, the actuator 124 may close the gate 122 when the robotic assembly 112 is finished removing and/or inserting at least one of the wafer 106 or the cleaning substrate 108. It is noted herein that the gate 122 may include any actuator 124 known in the art. For example, the gate 122 may include a hydraulic actuator, an electrical actuator, a mechanical actuator, or the like.

In another embodiment, the process chamber 102 and/or the chuck 110 may include a lift pin mechanism 126. The lift pin mechanism 126 may include one or more lift pins 128 positioned proximate to the chuck 110.

For example, at least some of the one or more pins 128 may be positioned inside an area defined by the surface 300 of the chuck 110. For instance, the at least some of the one or more pins 128 may be configured to pass through a corresponding opening in the area defined by the surface 300 of the chuck 110. In this example, the illustrations of in FIGS. 3A-3G may be considered a cross-section of the components of the process chamber 102.

By way of another example, at least some of the one or more pins 128 may be positioned outside of a defined area of the chuck 110. For instance, the at least some of the one or more pins 128 may ring the chuck 110. In this example, the illustrations of in FIGS. 3A-3G may be considered a side-view of the components of the process chamber 102.

The lift pin mechanism 126 may include an insulator 130. The one or more lift pins 128 may be at least partially surrounded by an insulator 130 to shield the chuck 110. For example, the insulator 130 may be in place to prevent the voltage used to actuate and electrify the one or more lift pins 128 from coming into contact with the chuck 110. For instance, the voltage may be supplied by a high voltage power supply 132 configured to drive and electrify the one or more lift pins 128 when the one or more lift pins 128 translate the cleaning substrate 108.

It is noted herein one or more of the chuck 110, the one or more lift pins 128 and/or the insulator 130 of the lift pin mechanism 126, and/or the high voltage power supply 132 may be considered components of a cleaning assembly 134, for purposes of the present disclosure.

Figure 2:
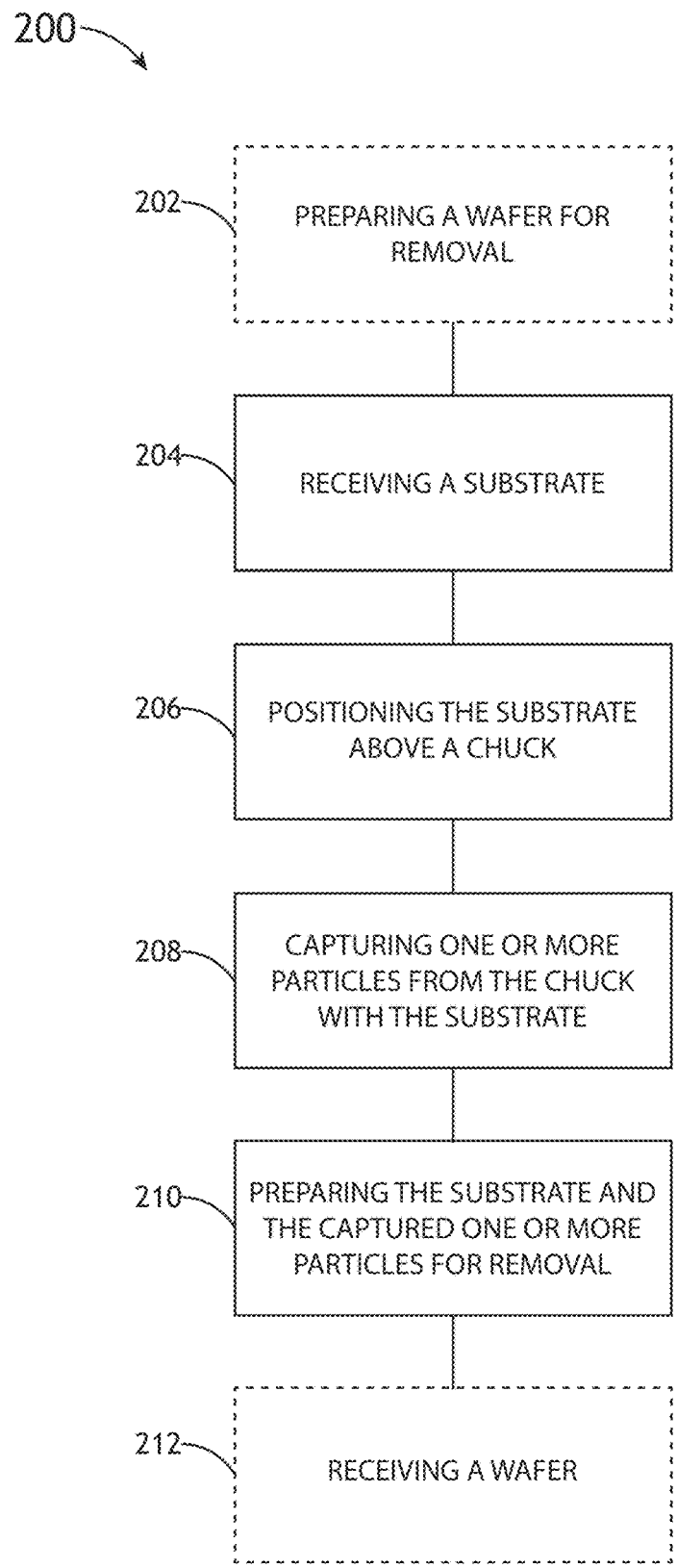
FIG. 2 illustrates a flow diagram of a method for chuck cleaning, in accordance with one or more embodiments of the present disclosure.

In another embodiment, the handling device 104 is configured to interact with at least one of the wafer 106 or the cleaning substrate 108. FIG. 2 is a method 200 for cleaning the chuck 110, in accordance with one or more embodiments of the present disclosure. FIGS. 3A-3G in general illustrate simplified block diagrams corresponding to steps of the method 200 for cleaning the chuck 110, in accordance with one or more embodiments of the present disclosure.

In a step 202, a wafer may be prepared for removal. The wafer 106 may be raised from the chuck 110 via the lift pin mechanism 126. The raising may be driven at least in part by voltage may be supplied by the high voltage power supply 132. The wafer 106 may be engaged by the handling device 104 after the wafer 106 is raised. It is noted herein the one or more lift pins 128 may start in the rest position or another position prior to engaging the wafer 106. In addition, it is noted herein the one or more lift pins 128 may return in a rest position or another position after the handling device 104 engages the wafer 106.

Figure 3A:
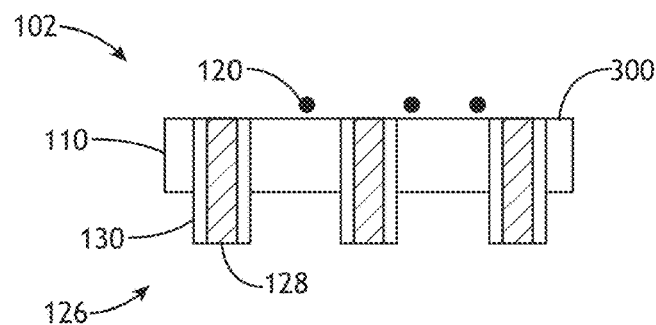
FIG. 3A illustrates a simplified schematic view of a chuck, in accordance with one or more embodiments of the present disclosure.
Figure 3B:
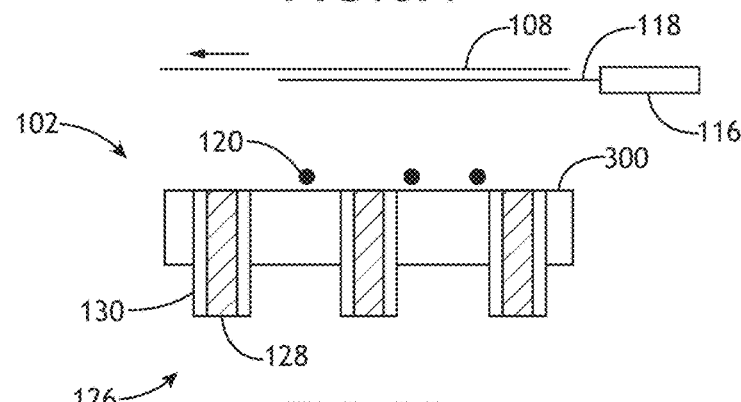
FIG. 3B illustrates a simplified schematic view of a chuck and a cleaning substrate, in accordance with one or more embodiments of the present disclosure.

In a step 204, a substrate may be received. As illustrated in FIG. 3A, the chuck 110 may include one or more particles 120. As illustrated in FIG. 3B, the cleaning substrate 108 may be inserted within the process chamber 102. For example, a handling device 104 may insert the cleaning substrate 108 in the process chamber 102. For instance, the robotic assembly 112 of the handling device 104, the robotic assembly 112 including the end effector 116 with the hand 118, may insert the cleaning substrate 108 within the process chamber 102.

Figure 3C:
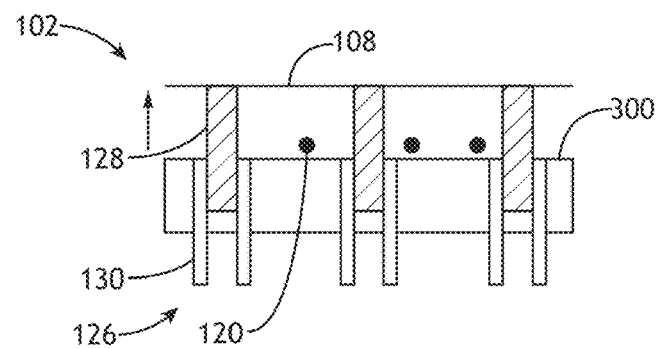
FIG. 3C illustrates a simplified schematic view of a chuck and a cleaning substrate, in accordance with one or more embodiments of the present disclosure.
Figure 3D:
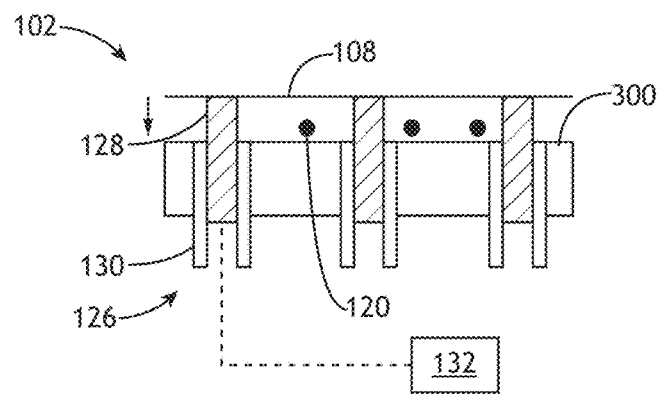
FIG. 3D illustrates a simplified schematic view of a chuck and a cleaning substrate, in accordance with one or more embodiments of the present disclosure.

In a step 206, the substrate may be positioned above a chuck. As illustrated in FIG. 3C, the one or more lift pins 128 may be configured to engage the cleaning substrate 108 in a first position above a surface 300 of the chuck 110. It is noted herein the process sub-system 100 may be configured to allow the handling device 104 and the one or more pins 128 to be in communication. For example, the one or more pins 128 may confirm the handling device has positioned the cleaning substrate 108 in the first position above the chuck 110 prior to the one or more lift pins 128 engaging the cleaning substrate 108 (e.g., similar to a handshake protocol). It is noted herein the one or more lift pins 128 may start in a rest position or another position between the rest position and the first position prior to engaging the cleaning substrate 108. As illustrated in FIG. 3D, the one or more lift pins 128 may be configured to translate the cleaning substrate 108 between the first position and a second position above the surface 300 of the chuck 110. For example, the second position of the cleaning substrate 108 may be closer to the surface 300 of the chuck 110 than the first position of the cleaning substrate 108. The translation between the first position and the second position may be driven at least in part by voltage may be supplied by the high voltage power supply 132. It is noted herein the second position may be a select distance above the surface 300 of the chuck 110, where the select distance is dependent on a size and/or a shape of the one or more particles 120.

Figure 3E:
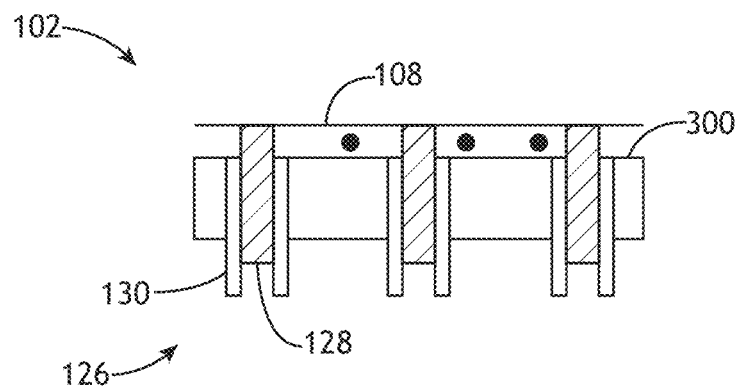
FIG. 3E illustrates a simplified schematic view of a chuck and a cleaning substrate, in accordance with one or more embodiments of the present disclosure.

In a step 208, one or more particles may be captured from the chuck with the substrate. As illustrated in FIG. 3E, the cleaning substrate 108 may be configured to capture the one or more particles 120 from the surface of the chuck 110 via at least one of electrostatic attraction or mechanical trapping when the cleaning substrate 216 is positioned in the second position. For example, electrostatic attraction may involve applying a voltage between the cleaning substrate 108 and the chuck 110 when the cleaning substrate 108 is in the second position. The translation between the first position and the second position may be completed prior to the capturing of the one or more particles 120. It is noted herein methods of capturing the one or more particles 120 via at least one of electrostatic attraction or mechanical trapping is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety.

Figure 3F:
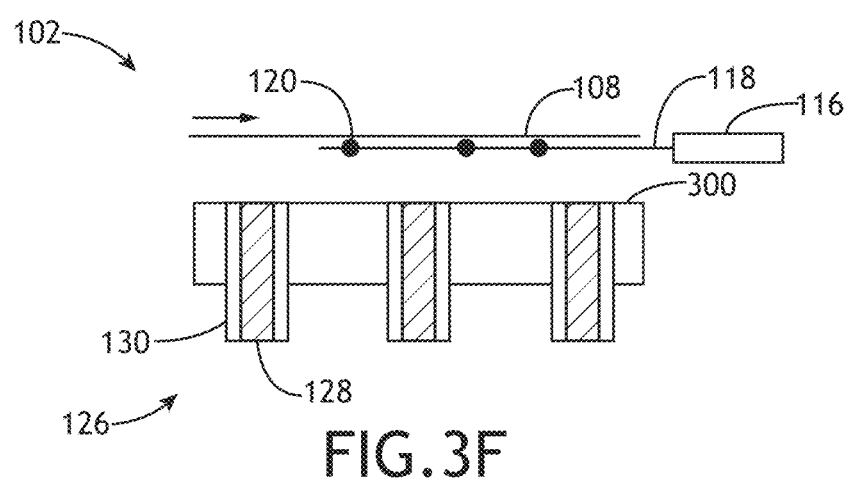
FIG. 3F illustrates a simplified schematic view of a chuck and a cleaning substrate, in accordance with one or more embodiments of the present disclosure.
Figure 3G:
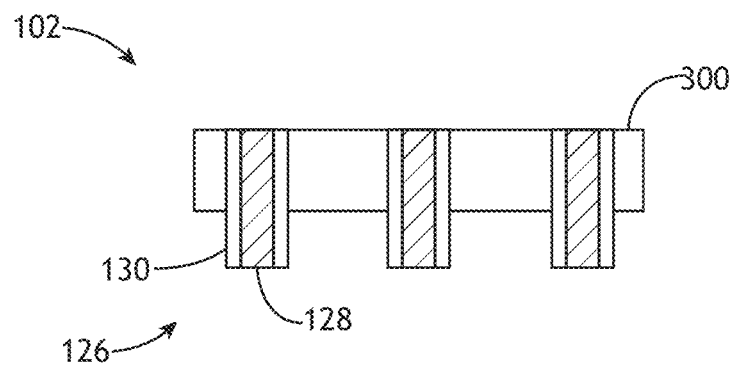
FIG. 3G illustrates a simplified schematic view of a chuck, in accordance with one or more embodiments of the present disclosure.

In a step 210, the substrate and the captured one or more particles may be prepared for removal. As illustrated in FIG. 3E, the one or more lift pins 128 may be configured to translate the cleaning substrate 108 and the captured one or more particles 120 between the second position and the first position after the capturing of the one or more particles 120 by the cleaning substrate 108 from the chuck 110. The capturing of the one or more particles 120 may be completed prior to the translation between the second position and the first position. The translation between the second position and the first position may be driven at least in part by voltage may be supplied by the high voltage power supply 132. As illustrated in FIG. 3F, the cleaning substrate 108 may be engaged by the handling device 104 when the cleaning substrate 108 and the captured one or more particles 120 are in the first position from the second position. It is noted herein the one or more lift pins 128 may return in a rest position or another position between the rest position and the first position after the handling device 104 engages the cleaning substrate 108.

In a step 212, a wafer may be received. The wafer 106 may be the same wafer 106 as was removed prior to the cleaning by the cleaning substrate 108 or may be a different wafer 106. The one or more lift pins 128 may be configured to engage the wafer 106. It is noted herein the one or more lift pins 128 may start in the rest position or another position prior to engaging the wafer 106.

In this regard, the handling device 104 may be configured to remove the wafer 106 from the one or more process chambers 102 after the one or more semiconductor fabrication processes are completed. In addition, the handling device 104 may be configured to insert the cleaning substrate 108 in the one or more process chambers 102 to clean the chuck 110. Further, the handling device 104 may be configured to remove the cleaning substrate 108 from the one or more process chambers 102 after the chuck 110 has been cleaned.

It is noted herein one or more steps of the method 200 may be optional. For example, steps 202 and/or 212 may be optional where the process sub-system 100 is in cleaning or calibration mode, such that a wafer is not currently in the process chamber 102. Therefore, the above description should not be interpreted as a limitation on the present disclosure but merely an illustration.

In another embodiment, the robotic assembly 112 is configured to interact with the replaceable top skin 136. The replaceable top skin 136 may be coupled to the chuck 110 via one or more coupling mechanisms 138. For example, the one or more coupling mechanisms 138 may include, but are not limited to, a mechanical clamping mechanism, an electrical clamping mechanism, and/or a pneumatic clamping mechanism. For instance, the one or more coupling mechanisms 138 may include, but are not limited to, a clamping mechanism on top or around the replaceable top skin 136, fasteners, an adhesive, applied surface tension from components external to the chuck 110 within the process chamber 102, electrostatic attraction, a vacuum assembly, or the like.

The replaceable top skin 136 may be configured to capture the one or more particles 120. For example, the one or more particles 120 may be passively captured by the replaceable top skin 136 after the one or more particles 120 fall on the replaceable top skin 136 via gravity. By way of another example, the one or more particles 120 may be actively captured (e.g., secured) by the replaceable top skin 136 after the one or more particles 120 fall on the replaceable top skin 136 via at least one of electrostatic attraction or mechanical trapping. It is noted herein methods of capturing the one or more particles 120 via at least one of electrostatic attraction or mechanical trapping is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety.

It is noted herein one or more of the chuck 110, the replaceable top skin 136, and/or the coupling mechanism 138 may be considered components of the cleaning assembly 134, for purposes of the present disclosure. Although embodiments of the present disclosure separately illustrate the lift pin mechanism 126 and the replaceable top skin 136 within the cleaning assembly 134, it is noted herein the lift pin mechanism 126 and the replaceable top skin 136 may be simultaneously implemented for cleaning the chuck 110 within the cleaning assembly 134. For example, the lift pin mechanism 126 may assist in preparing the wafer 106 for removal and/or preparing the replaceable top skin 136 for removal from the process chamber 102. By way of another example, the lift pin mechanism 126 may assist in installing a replaceable top skin 136 on the chuck 110. Therefore, the above description should not be interpreted as a limitation on the scope of the present disclosure but merely an illustration.

Figure 4:
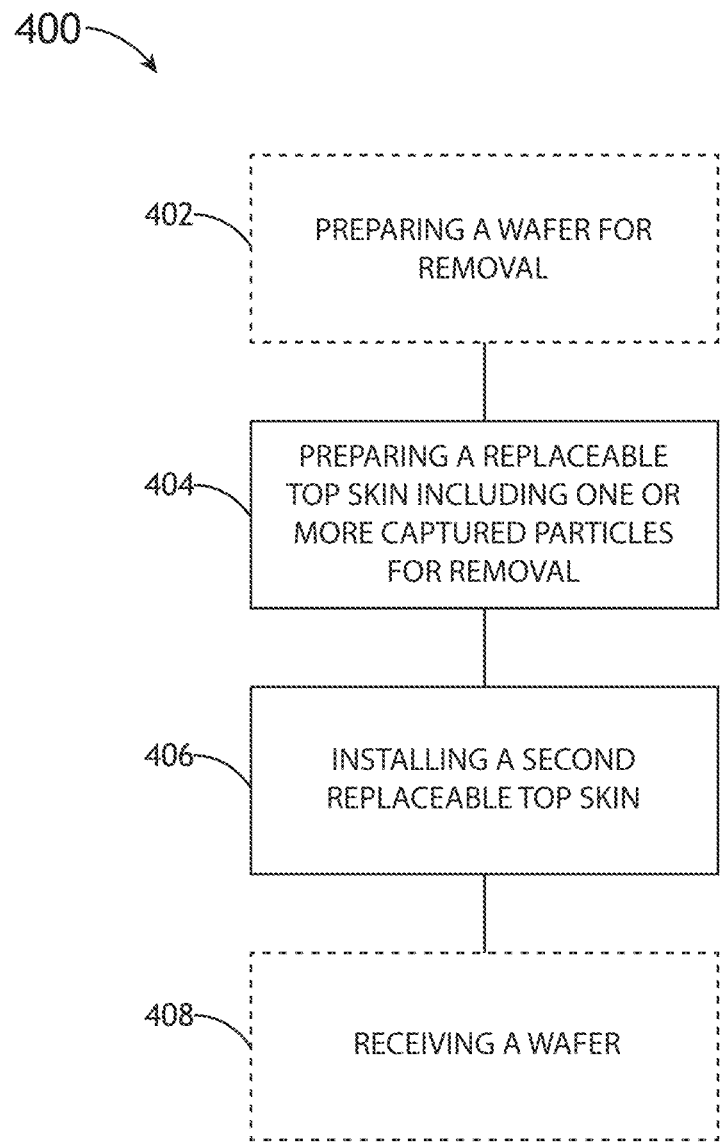
FIG. 4 illustrates a flow diagram of a method for chuck cleaning, in accordance with one or more embodiments of the present disclosure.

FIG. 4 is a method 400 for cleaning the chuck 110, in accordance with one or more embodiments of the present disclosure.

In a step 402, a wafer may be prepared for removal. Where the lift pin mechanism 126 is installed in the process chamber 102, the wafer 106 may be raised from the chuck 110 via the lift pin mechanism 126. The raising may be driven at least in part by voltage may be supplied by the high voltage power supply 132. It is noted herein the one or more lift pins 128 may start in the rest position or another position prior to engaging the wafer 106. In addition, it is noted herein the one or more lift pins 128 may return in a rest position or another position after the handling device 104 engages the wafer 106. In addition, the handling device 104 may be configured to manage the positioning of the wafer 106 within the process chamber 102. The wafer 106 may be engaged by the handling device 104 after the wafer 106 is raised.

In a step 404, a replaceable top skin including one or more captured particles may be prepared for removal. The replaceable top skin 136 may capture one or more particles 120. For example, the one or more particles 120 may be passively captured by the replaceable top skin 136 after the one or more particles 120 fall on the replaceable top skin 136 via gravity. By way of another example, the one or more particles 120 may be actively captured (e.g., secured) by the replaceable top skin 136 after the one or more particles 120 fall on the replaceable top skin 136. It is noted herein methods of capturing the one or more particles 120 via at least one of electrostatic attraction or mechanical trapping is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety. The coupling mechanism 138 may be undone, allowing for the replaceable top skin 136 to be removed from the process chamber 102. For example, the replaceable top skin 136 may be removed from the process chamber 102 via the handling device 104.

In a step 406, a second replaceable top skin may be installed. The second replaceable top skin 136 may be installed after the removal of the replaceable top skin 136 with the captured one or more particles 120. The second replaceable top skin 136 may be inserted within the process chamber 102. For example, the second replaceable top skin 136 may be inserted into the process chamber 102 via the handling device 104.

In a step 408, a wafer may be received. The wafer 106 may be the same wafer 106 as was removed prior to the cleaning by the cleaning substrate 108 or may be a different wafer 106. Where the one or more lift pins 128 are installed within the process chamber 102, the one or more lift pins 128 may be configured to engage the wafer 106. It is noted herein the one or more lift pins 128 may start in the rest position or another position prior to engaging the wafer 106. In addition, the handling device 104 may be configured to manage the positioning of the wafer 106 within the process chamber 102.

It is noted herein one or more steps of the method 400 may be optional. For example, steps 402 and/or 408 may be optional where the process sub-system 100 is in cleaning or calibration mode, such that a wafer is not currently in the process chamber 102. Therefore, the above description should not be interpreted as a limitation on the present disclosure but merely an illustration.

It is noted herein the permittivity of the one or more particles 120 may have a direct effect on cleaning process time. As such, configuring the components of the handling device 104, the cleaning substrate 108, and/or the replaceable top skin 136 may to increase an amount of operating time (e.g., improving resistance to high temperatures, or the like) may result in more efficient cleaning methods 200, 400 for high-permittivity materials including, but not limited to, quartz, OX film, or other high-permittivity materials. The effect of material permittivity on cleaning process time in terms of temperature and/or pressure) of process chamber 102 is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety.

Although embodiments of the disclosure illustrate the use of the lift pin mechanism 126 and/or the replaceable top skin 136 with a process sub-system 100, it is noted herein the lift pin mechanism 126 and/or the replaceable top skin 136 may be usable with any type of process sub-system (e.g., process tool, or the like) and/or any type of characterization sub-system (e.g., characterization tool such as a review tool, inspection tool, or the like), as described throughout the disclosure. In addition, in general the lift pin mechanism 126 and/or the replaceable top skin 136 may be usable in any device suitable for securing or storing a sample such as a wafer before, during, or after any processing step, any characterizing step, or the like, as described throughout the disclosure.

Figure 5:
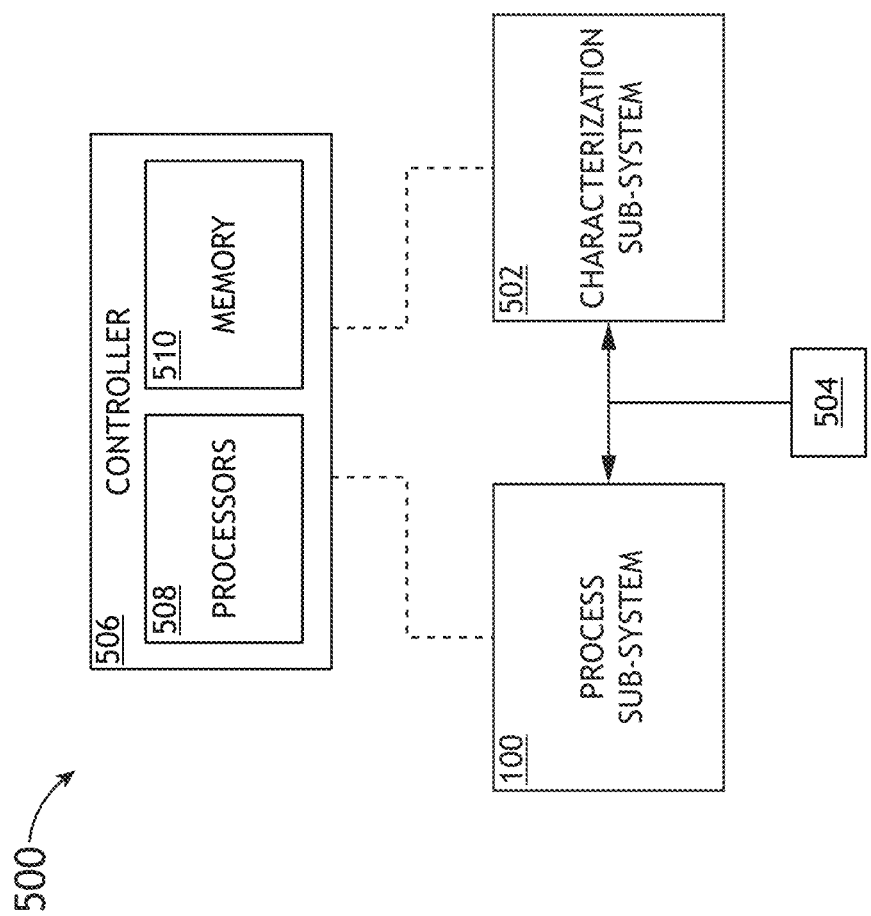
FIG. 5 illustrates a simplified schematic view of a system including process sub-systems, characterization sub-systems, and controllers, in accordance with one or more embodiments of the present disclosure.
Figure 6:
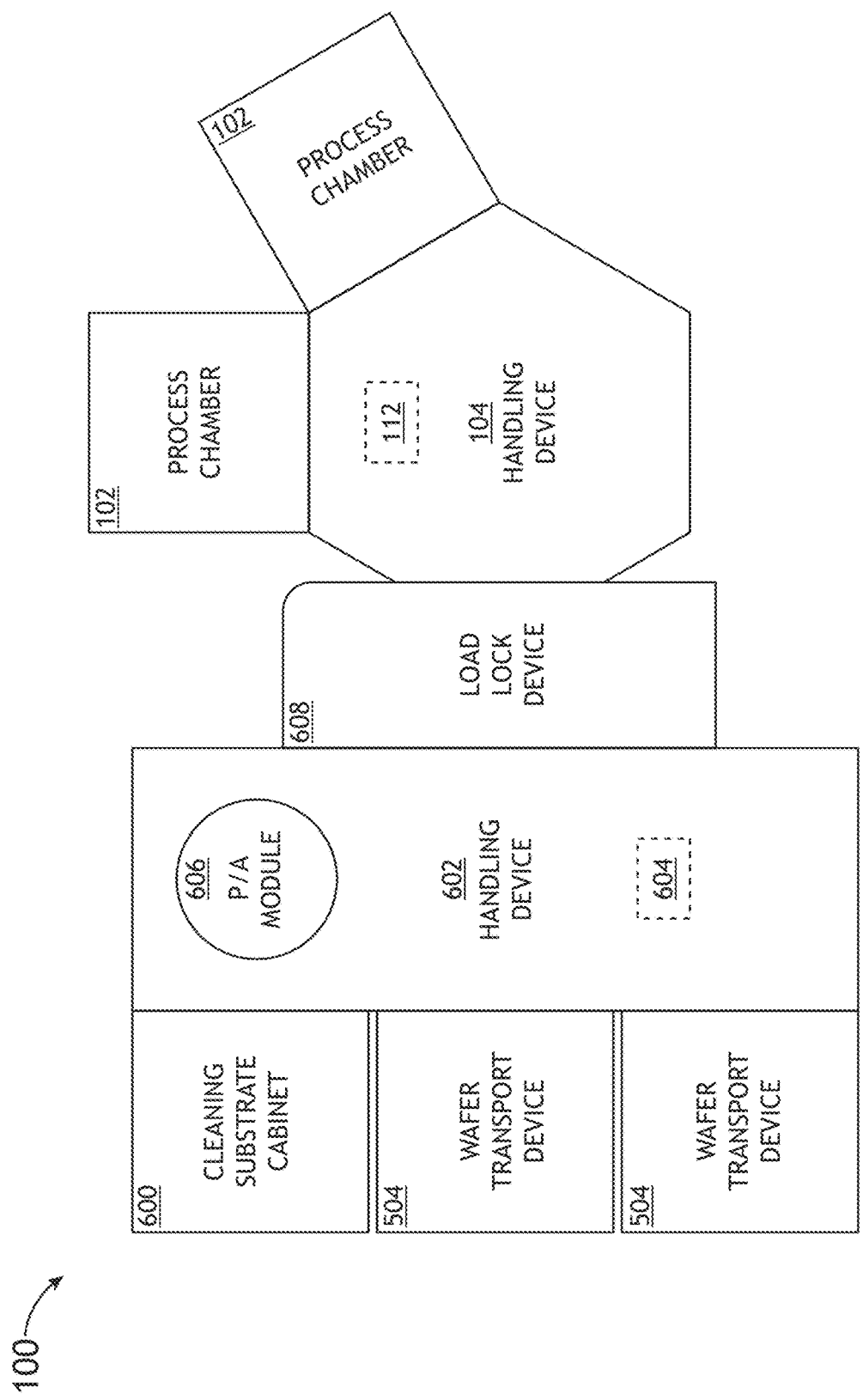
FIG. 6 illustrates a simplified schematic view of a process sub-system, in accordance with one or more embodiments of the present disclosure.

FIGS. 5 and 6 in general illustrate a system 500 configured to perform one or more steps of the methods 200, 400 for cleaning the chuck 110, in accordance with one or more embodiments of the present disclosure.

In one embodiment, the system 500 includes the one or more process sub-systems 100 (e.g., process tools). In another embodiment, the system 500 includes one or more characterization sub-systems 502 (e.g., characterization tools).

In another embodiment, the one or more characterization sub-systems 502 include one or more inspection tools. For example, the one or more inspection tools may include, but are not limited to, an optical characterization tool. For instance, the optical characterization tool may include an optical characterization tool capable of generating one or more high-resolution images representing the electrical intent of the wafer 106 and capable of operating at a wavelength corresponding to, but not limited to, visible light, ultraviolet (UV) radiation, deep ultraviolet (DUV) radiation, vacuum ultraviolet (VUV) radiation, extreme ultraviolet (EUV) radiation, and/or X-ray radiation. In addition, the optical characterization tool may include a broadband inspection tool including, but not limited to, a laser sustained plasma (LSP) based inspection tool. Further, the optical characterization tool may include a narrowband characterization tool, such as, but not limited to, a laser scanning inspection tool. A description of an inspection tool is described in U.S. Pat. No. 8,559,001, issued Oct. 15, 2013, which is incorporated herein by reference in the entirety. Additionally, a description of an inspection tool is described in U.S. Pat. No. 9,170,209, issued Oct. 27, 2015, which is incorporated herein in the entirety. Further, a description of an inspection tool is described in U.S. Pat. No. 8,749,149, issued Jun. 10, 2014, which is incorporated herein in the entirety. Additionally, a description of an inspection tool is described in U.S. Pat. No. 8,941,336, issued Jan. 27, 2015, which is incorporated herein by reference in the entirety.

In another embodiment, the one or more characterization sub-systems 502 include one or more review tools. For example, the one or more characterization sub-systems 502 include one or more particle-beam review tools. For instance, the one or more particle-beam review tools may include, but is not limited to, an electron-beam (e-beam) tool. A description of a particle-beam review tool is described in U.S. patent application Ser. No. 16/163,263, filed Oct. 17, 2018, which is incorporated herein by reference in the entirety. Additionally, a description of a particle-beam review tool is described in U.S. patent application Ser. No. 16/564,981, filed Sep. 9, 2019, which is incorporated herein by reference in the entirety.

In another embodiment, the one or more characterization sub-systems 502 include one or more tools configured to characterize based on particle chemical compound. For example, the being configured to characterize based on particle chemical compound may be in the alternative to or in addition to being configured to characterize based on particle mechanical properties such as inspection or review characterization).

In another embodiment, the system 500 includes one or more wafer transport devices 504 (e.g., one or more front opening universal pods (FOUPs) 504) configured to carry a wafer lot of wafers 106, a cleaning substrate 108, and/or a replaceable top skin 136 between the characterization sub-system 502 and the process sub-system 100. In this regard, the characterization sub-system 502 and the process sub-system 100 may be configured to receive the one or more FOUP 504.

It is noted herein that the terms "FOUP" and "wafer transport device" may be used interchangeably for the purposes of the present disclosure, unless noted otherwise herein. A description of the use of a wafer transport device is described in U.S. Patent Publication No. 2019/0295874, published Sep. 26, 2019, which is incorporated herein by reference in the entirety. In addition, a description of the use of a wafer transport device is described in U.S. Pat. No. 10,177,020, issued on Jan. 8, 2019, which is incorporated herein by reference in the entirety.

In another embodiment, the system 500 includes a controller 506 coupled (e.g., physically and/or communicatively coupled) to the one or more process sub-systems 100 and/or one or more characterization sub-systems 502. In another embodiment, the controller 506 includes one or more processors 508. In another embodiment, the controller 506 is operably coupled to one or more components of the system 500. For example, the controller 506 may be operably coupled to the one or more process sub-systems 100, the one or more characterization sub-systems 502, and/or one or more additional components. In this regard, the controller 506 may direct any of the components of the system 500 and/or any components of the one or more process sub-systems 100, the one or more characterization sub-systems 502, and/or the one or more additional components to carry out any one or more of the various functions described throughout the present disclosure.

In another embodiment, system 500 may include the controller 506 communicatively coupled to the server via network. In another embodiment, controller 506 includes the one or more processors 508 and memory 510. In another embodiment, the one or more processors 508 may be configured to execute a set of program instructions stored in memory 510, wherein the set of program instructions are configured to cause the one or more processors 508 to carry out the steps of the present disclosure. It is noted herein that the discussion herein regarding server, one or more processors 508, and memory 510 may also be regarded as applying to controller 506, one or more processors 508, and memory 510, unless noted otherwise herein.

It is noted herein that the one or more components of system 500 may be communicatively coupled to the various other components of system 500 in any manner known in the art. For example, the one or more processors 508 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

In one embodiment, the one or more processors 508 may include any one or more processing elements known in the art. In this sense, the one or more processors 508 may include any microprocessor-type device configured to execute software algorithms and/or instructions. In one embodiment, the one or more processors 508 may consist of a desktop computer, mainframe computer system, workstation, image computer, parallel processor, or other computer system (e.g., networked computer) configured to execute a program configured to operate the system 500, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 508. In general, the term "processor" may be broadly defined to encompass any device having one or more processing elements, which execute program instructions from memory 510. Moreover, different subsystems of the system 500 may include processor or logic elements suitable for carrying out at least a portion of the steps described throughout the present disclosure. Therefore, the above description should not be interpreted as a limitation on the present disclosure but merely an illustration.

The memory 510 may include any storage medium known in the art suitable for storing program instructions executable by the associated one or more processors 508 and the data received from the transmitting devices. For example, the memory 510 may include a non-transitory memory 510 medium. For instance, the memory 510 may include, but is not limited to, a read-only memory 510 (ROM), a random access memory 510 (RAM), a magnetic or optical memory 510 device (e.g., disk), a magnetic tape, a solid state drive and the like. In another embodiment, the memory 510 is configured to store data including, but not limited to, entity data, association data (e.g., spatial relationship data), operations data, GPS data, time-stamped data, geo-fenced data, and the like received from transmitting devices. It is further noted that memory 510 may be housed in a common controller housing with the one or more processors 508. In an alternative embodiment, the memory 510 may be located remotely with respect to the physical location of the processors 508, server, controller, and the like. In another embodiment, the memory 510 maintains program instructions for causing the one or more processors 508 to carry out the various steps described through the present disclosure.

In another embodiment, the characterization sub-system 502 is a separate device from the process sub-system 100. In another embodiment, the process sub-system 100 is configured to receive the one or more FOUP 504 configured to carry a wafer lot of wafers 106, a cleaning substrate 108, and/or a replaceable top skin 136 between the characterization sub-system 502 and the process sub-system 100.

In another embodiment, the process sub-system 100 includes a cleaning substrate cabinet 600. In another embodiment, the cleaning substrate cabinet 600 is configured to prepare the one or more cleaning substrates 108 for operation (e.g., cleaning the chuck 110). An example embodiment of the cleaning substrate cabinet 600 is described in further detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety.

In another embodiment, the process sub-system 100 includes a second handling device 602. The process sub-system 100 may include any handling device 602 known in the art. For example, the process sub-system 100 may include an atmospheric handling device. For instance, the atmospheric handling device may be at or near atmospheric pressure. By way of another example, the process sub-system 100 may include a vacuum handling device. For instance, the vacuum handling device may be at or near vacuum pressure. For purposes of the present disclosure, "vacuum pressure" is interpreted to mean any pressure that is lower than atmospheric pressure.

The handling device 602 may include a robotic assembly 604. Although not shown, the robotic assembly 604 may also include a robot and an end effector. It is noted herein that the robotic assembly 604 may include any type of robot known in the art. For example, the robotic assembly 604 may include at least one of an atmospheric robot or a vacuum robot. For instance, the robotic assembly 604 may include at least one of an atmospheric internal rotary robot or a vacuum internal rotary robot. In general, any embodiment directed to the robotic assembly 112 and/or the components of the robotic assembly 112 may be directed to the robotic assembly 604 and/or components of the robotic assembly 604.

It is noted herein that various systems and subsystems within the process sub-system 100 may share any number of components. For example, the process sub-system 100 may share one or more components between the handling devices 104, 602. By way of another example, the process sub-system 100 may share one or more components between the one or more robotic assemblies 112, 604.

The handling device 602 may be configured to receive the cleaning substrate cabinet 600 containing the one or more cleaning substrates 108. By way of another example, the handling device 602 may also be configured to receive the one or more FOUPs 504 containing the wafer lot (e.g., wafers 106). In another embodiment, the robotic assembly 604 is configured to extract at least one of the wafer 106 from the wafer lot of the FOUP 504 or the cleaning substrate 108 from the cleaning substrate cabinet 600. In another embodiment, the process sub-system 100 returns at least one of the wafer 106 or the cleaning substrate 108 to the FOUP 504 using at least one of the robotic assembly 112 or the robotic assembly 604. For example, the process sub-system 100 may return the wafer 106 to the FOUP 504 via the robotic assembly 604 and/or the robotic assembly 112 before the cleaning substrate 108 is transported (e.g., delivered) to the one or more process chambers 102. For instance, the cleaning substrate 108 may be transported (e.g., delivered) to the one or more process chambers 102 after the wafer 106 is removed, such that the cleaning substrate 108 may remove the one or more particles 120 from the chuck 110 in the one or more process chambers 102.

The FOUP 504 may transfer the wafer lot of wafers 106, the cleaning substrate 108 including the captured one or more particles 120, and/or a replaceable top skin 136 including the captured one or more particles 120 to the characterization sub-system 502 for analysis. The one or more particles 120 may be analyzed with a characterization sub-system 502. For example, the handling device 104 may remove the cleaning substrate 108 and the captured one or more particles 120 from the process chamber 102, where the captured one or more particles may be analyzable by the characterization sub-system 502 following an actuation of the handling device 104 to the characterization sub-system 502. For instance, the cleaning substrate 108 including the captured one or more particles 120 may be actuated to the characterization sub-system 502 via the handling device 104. In addition, the replaceable top skin 136 including the captured one or more particles 120 may be actuated to the characterization sub-system 502 via the handling device 104.

In another embodiment, the process sub-system 100 includes a pre-alignment (P/A) module 606 configured to align an orientation of the wafer 106 or the cleaning substrate 108. For example, the P/A module 606 may include one or more optical sensors configured to detect a notch on a surface (e.g., top side or bottom side) the wafer 106 or the cleaning substrate 108. After the notch is detected, the P/A module 606 may position the center of the wafer 106 or the center of the cleaning substrate 108 using any algorithm known in the art.

In another embodiment, the process sub-system 100 includes a load lock device 608 configured to receive at least one of the wafer 106 or the cleaning substrate 108. The load lock device 608 may include any load lock device 608 known in the art, including but not limited to, a vacuum load lock device, an atmospheric load lock device, or the like. For example, the load lock device 608 may be an atmospheric load lock device 608. For instance, the atmospheric load lock device 608 may be configured to receive at least one of the wafer 106 or the cleaning substrate 108 while at or near atmospheric pressure (14.696 psi).

In another embodiment, the load lock device 608 containing at least one of the wafer 106 or the cleaning substrate 108 is configured to receive air until a sufficient pressure level is achieved. For example, the load lock device 608 may be configured to receive air until the load lock device 608 reaches a high vacuum pressure (e.g., 10-5 to 10-8).

Figure 7:
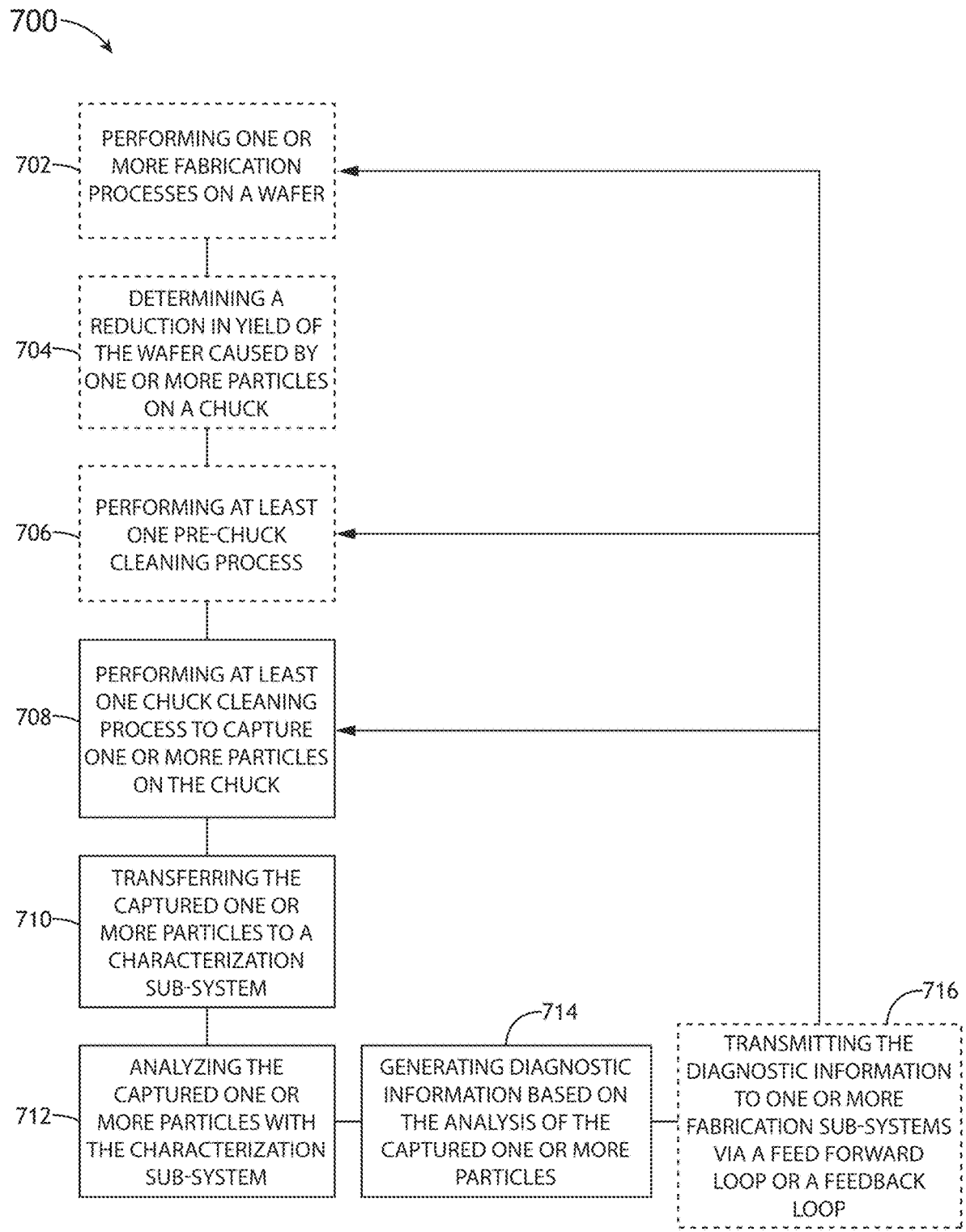
FIG. 7 illustrates a flow diagram of a method for chuck cleaning, in accordance with one or more embodiments of the present disclosure.

FIG. 7 is a method 700 for analyzing captured particles 120, in accordance with one or more embodiments of the present disclosure.

In a step 702, one or more fabrication processes may be performed on a wafer. The wafer 106 may deposit the one or more particles 120 onto the chuck 110 during the one or more fabrication processes. Further, one or more walls of the process chamber 102 of the process sub-system 100 may deposit the one or more particles 120 onto the chuck 110.

In a step 704, a reduction in yield caused by one or more particles on a chuck may be determined. A wafer 106 may be transferred to a characterization sub-system 502 via one or more components of the system 100 including, but not limited to, a series of handling devices 104, 604, one or more FOUPs 504, or the like.

The wafer 106 may be characterized to determine a yield within the lot. A surface of a wafer 106 may be inspected via one or more characterization sub-systems 502 and pre-cleaning characterization data may be generated. For example, the one or more characterization sub-systems 502 may be configured to inspect a bottom surface and/or a top surface of the wafer 106 and/or the surface 300 of the chuck 110 to generate pre-cleaning inspection data about the surface of the wafer 106 and/or the surface 300 of the chuck 110. For instance, it may be determined whether the yield falls below a pre-selected threshold. By way of another example, it may be determined whether the yield includes defects exceeding a selected threshold in terms of one or more parameters including, but not limited to, number, size, or the like.

In a step 706, at least one pre-chuck cleaning process may be performed. The at least one pre-chuck cleaning process may be performed based on one or more cleaning parameters. The one or more cleaning parameters may include at least one of preparation of the cleaning substrate 216, commencement of a cleaning cycle, orientation of the cleaning substrate 216, or the like. In one example, the at least one pre-cleaning process may include, but is not limited to, a plasma or gas phase cleaning process. For instance, the gas phase cleaning process may use redundant toxic elements including, but not limited to, fluorine.

In a step 708, at least one chuck cleaning process to capture one or more particles on the chuck may be performed. For example, the at least one chuck cleaning process may in general include one or more steps of the method 200, as described in detail above with respect to at least FIG. 2. It is noted herein the cleaning substrate 108 may itself be cleaned following the capturing the one or more particles 120 from the chuck 110 by the cleaning substrate 108 and the analysis of the one or more particles 120. By way of another example, the at least one chuck cleaning process may in general include one or more steps of the method 400, as described in detail above with respect to at least FIG. 4.

It is noted herein, where the particles 120 are captured with electrostatic attraction, it is noted herein the one or more particles 120 may be charged at some point prior to step 706. In addition, it is noted herein the at least one pre-cleaning process of step 704 may not be required where the at least one chuck cleaning process includes removing and installing replaceable top skins 136 from the chuck 110. Further, it is noted herein additional chuck cleaning processes are described in detail in U.S. patent application Ser. No. 16/682,814, filed Nov. 13, 2019, listing Mor Azaria, Giampietro Bieli, Shai Mark, Adi Pahima, and Yoram Uziel as inventors, which is previously incorporated herein by reference in the entirety.

In a step 710, the captured one or more particles may be transferred to a characterization sub-system. The captured one or more particles 120 may be transferred via an embedded automation system (AM system), as described in detail above with respect to at least system 500 in FIG. 5 and the process sub-system 100 in FIGS. 1A-1C and 6. For example, the captured one or more particles 120 may be transferred to a characterization sub-system 502 via one or more components of the system 100 including, but not limited to, a series of handling devices 104, 604, one or more FOUPs 504, or the like.

In a step 712 the captured one or more particles may be analyzed with the characterization sub-system. The characterization sub-system 502 may image a surface of the cleaning substrate 108 in order to capture images of the captured one or more particles 120 on the surface of the cleaning substrate 108. In one example, the characterization sub-system 502 may perform, but is not limited to, an energy dispersive X-ray (EDX) spectroscopy automated analysis.

It is noted herein the one or more characterization sub-systems 502 and/or the one or more process sub-systems 100 of system 500 may perform a single function or multiple functions. For example, a first characterization sub-system 502 may be configured to inspect a surface of the wafer 106, while a second characterization sub-system 502 may be configured to inspect a surface of the cleaning substrate 108 and/or the replaceable top skin 136. By way of another example, a characterization sub-system 502 may be configured to inspect a surface of the wafer 106 and a surface of the cleaning substrate 108.

In a step 714, diagnostic information may be generated based on the analysis of the captured one or more particles. For example, the diagnostic information may include, but is not limited to, information about particle size, shape, material or chemical compound, location on the cleaning substrate 108 and/or the replaceable top skin 136 and its corresponding location on the wafers 106, or the like. By way of another example, the diagnostic information may include, but is not limited to, history of a sub-system or tool within the system 500.

In a step 716, the diagnostic information may be transmitted to one or more fabrication sub-systems via a feed forward loop or a feedback loop. For example, the transmitting the feed forward loop or the feedback loop may serve to correct the reduction in yield caused by the one or more particles 120 in the same or future lots of wafer 106. By way of another example, the transmitting the feed forward loop or the feedback loop may be used in the configuration of future cleaning substrates 108.

In this regard, the method 700 may be fully automated.

It is noted herein one or more steps of the method 700 may be optional. For example, steps 402 and/or 408 may be optional where the process sub-system 100 is in cleaning or calibration mode, such that a wafer is not currently in the process chamber 102. Therefore, the above description should not be interpreted as a limitation on the present disclosure but merely an illustration.

In general, it is noted herein the methods 200, 400, 700 are not limited to the steps and/or sub-steps provided. The methods 200, 400, 700 may include more or fewer steps and/or sub-steps. In addition, the methods 200, 400, 700 may perform the steps and/or sub-steps simultaneously. Further, the methods 200, 400, 700 may perform the steps and/or sub-steps sequentially, including in the order provided or an order other than provided. Further, it is noted herein that the steps of methods 200, 400, 700 may be implemented all or in part by the systems 100, 500. Further, the methods 200, 400, 700 is not limited to the systems 100, 500 in that additional or alternative system-level embodiments may carry out all or part of the steps of the methods 200, 400, 700. Therefore, the above description should not be interpreted as a limitation on the scope of the disclosure but merely an illustration.

In this regard, using the handling device 104 to insert and/or remove the wafer 106, the cleaning substrate 108 and/or the replaceable top skin 136 may allow the cleaning assembly 134 and the methods 200, 400 to be compatible with existing process sub-systems 100 and characterization sub-systems 502. In addition, the cleaning assembly 134 and the methods 200, 400 should not be limited by temperature and/or pressure, being able to operate in process tool operating temperature (e.g., in excess of 400° C.) and/or pressure (e.g., in high vacuum). Further, the cleaning assembly 134 and the methods 200, 400 should not have a duration limitation within the process chamber 102 of the process sub-system 100 (e.g., limited by temperature and/or pressure). Further, the cleaning assembly 134 and the methods 200, 400 should not require a dissembling the process sub-system 100 for cleaning.

All of the methods described herein may include storing results of one or more steps of the method embodiments in memory 510. The results may include any of the results described herein and may be stored in any manner known in the art. The memory 510 may include any memory 510 described herein or any other suitable storage medium known in the art. After the results have been stored, the results can be accessed in the memory 510 and used by any of the method or system embodiments described herein, formatted for display to a user, used by another software module, method, or system, and the like. Furthermore, the results may be stored "permanently," "semi-permanently," temporarily," or for some period of time. For example, the memory 510 may be random access memory 510 (RAM), and the results may not necessarily persist indefinitely in the memory 510.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A cleaning assembly, comprising:
   a chuck; and
   a plurality of lift pins positioned proximate to the chuck, wherein the plurality of lift pins are configured to engage a cleaning substrate in a first position above a surface of the chuck, wherein the plurality of lift pins are configured to translate the cleaning substrate between the first position and a second position above the surface of the chuck, wherein the second position of the cleaning substrate is closer to the surface of the chuck than the first position of the cleaning substrate, wherein the cleaning substrate is configured to capture one or more particles from the surface of the chuck via at least one of electrostatic attraction or mechanical trapping when the cleaning substrate is positioned in the second position; and
   a power supply configured to drive the plurality of lift pins to translate the cleaning substrate between the first position and the second position.

2. The cleaning assembly of claim 1, wherein at least some of the plurality of pins are positioned inside an area defined by the surface of the chuck, wherein the at least some of the plurality of pins are configured to pass through a corresponding opening in the area defined by the surface of the chuck.

3. The cleaning assembly of claim 1, wherein at least some of the plurality of pins are positioned outside of a defined area of the chuck.

4. The cleaning assembly of claim 1, the chuck being shielded from at least some of the plurality of pins by an insulator surrounding the plurality of pins.

5. The cleaning assembly of claim 1, wherein the second position is a select distance above the surface of the chuck, wherein the select distance is dependent on at least one of a size or a shape of the one or more particles.

6. The cleaning assembly of claim 1, wherein the one or more particles are analyzable by a characterization sub-system.

7. The cleaning assembly of claim 6, wherein the cleaning substrate is received from a handling device when the cleaning substrate is positioned in the first position prior to the capturing of the one or more particles from the chuck.

8. The cleaning assembly of claim 7, wherein the cleaning substrate is returned to the handling device when the cleaning substrate is translated to the first position from the second position after the capturing of the one or more particles by the cleaning substrate from the chuck, wherein the one or more particles are analyzable by the characterization sub-system following an actuation of the handling device to the characterization sub-system.

9. The cleaning assembly of claim 8, wherein the plurality of lift pins actuate from a rest position to receive the cleaning substrate from the handling device, wherein the plurality of lift pins actuate to the rest position after the cleaning substrate is received by the handling device.

10. The cleaning assembly of claim 6, wherein the surface of the chuck is a replaceable top skin coupled to the chuck, wherein the replaceable top skin is configured to capture the one or more particles.

11. The cleaning assembly of claim 10, wherein the replaceable top skin is configured to passively capture the one or more particles.

12. The cleaning assembly of claim 10, wherein the replaceable top skin is configured to actively capture the one or more particles via at least one of electrostatic attraction or mechanical trapping.

13. The cleaning assembly of claim 10, wherein the replaceable top skin is replaceable by a handling device, wherein the one or more particles are analyzable by the characterization sub-system following an actuation of the handling device to the characterization sub-system.

14. The cleaning assembly of claim 6, the characterization sub-system including at least one of an inspection tool or a particle review tool.

15. A method comprising:
    receiving a cleaning substrate in a first position above a surface of a chuck with a plurality of lift pins;
    translating, with a power supply, the cleaning substrate to a second position above the surface of the chuck from the first position via the plurality of lift pins, wherein the second position of the cleaning substrate is closer to the surface of the chuck than the first position of the cleaning substrate;
    capturing one or more particles from the surface of the chuck by the cleaning substrate via at least one of electrostatic attraction or mechanical trapping when the cleaning substrate is in the second position; and
    translating the cleaning substrate to the first position after the capturing the one or more particles from the chuck by the cleaning substrate, wherein motion of the plurality of lift pins is driven by a power supply.

16. The method of claim 15, wherein the cleaning substrate is positioned in the first position above the chuck by a handling device.

17. The method of claim 16, wherein the plurality of lift pins are actuatable from a rest position to receive the cleaning substrate from the handling device.

18. The method of claim 17, wherein the substrate is received by the handling device in the first position after the capturing the one or more particles from the chuck by the cleaning substrate, wherein the one or more particles are analyzable by a characterization sub-system following an actuation of the handling device to the characterization sub-system.

19. The method of claim 18, wherein the plurality of lift pins are actuatable to the rest position after the cleaning substrate is received by the handling device.

20. A cleaning assembly, comprising:
    a chuck; and
    a replaceable top skin coupled to the chuck, wherein the replaceable top skin is configured to capture one or more particles, wherein the replaceable top skin is removable by a handling device, wherein the one or more particles are analyzable by a characterization sub-system following an actuation of the handling device to the characterization sub-system.

21. The cleaning assembly of claim 20, wherein the replaceable top skin is configured to passively capture the one or more particles.

22. The cleaning assembly of claim 20, wherein the replaceable top skin is configured to actively capture the one or more particles via at least one of electrostatic attraction or mechanical trapping.

23. A method comprising:
    removing a replaceable top skin from a chuck via a handling device, wherein the replaceable top skin is configured to capture one or more particles, wherein the replaceable top skin is removable by the handling device, wherein the one or more particles are analyzable by a characterization sub-system following an actuation of the handling device to the characterization sub-system.

24. The method of claim 23, wherein the replaceable top skin is configured to passively capture the one or more particles.

25. The method of claim 23, wherein the replaceable top skin is configured to actively capture the one or more particles via at least one of electrostatic attraction or mechanical trapping.

26. The method of claim 23, further comprising:
    installing a second replaceable top skin on the chuck after the removal of the replaceable top skin with the captured one or more particles.

27. A system, comprising:
    a chuck;
    at least one chuck cleaning assembly configured to remove one or more particles from a surface of the chuck via at least one cleaning process, wherein the at least one chuck cleaning assembly comprises: a plurality of lift pins positioned proximate to the chuck, wherein the plurality of lift pins are configured to translate the cleaning substrate between the first position and a second position above the surface of the chuck, wherein the plurality of lift pins are driven by a power supply, wherein the cleaning substrate is configured to capture one or more particles from the surface of the chuck via at least one of electrostatic attraction or mechanical trapping when the cleaning substrate is positioned in the second position;
    a characterization sub-system configured to analyze the one or more particles; and
    a handling device configured to transfer the one or more particles to the characterization sub-system.

28. The system of claim 27, wherein the at least one chuck cleaning assembly comprises:
    a replaceable top skin coupled to the chuck and configured to operate as the surface of the chuck, wherein the replaceable top skin is configured to capture the one or more particles, wherein the replaceable top skin is removable by the handling device.

29. The system of claim 28, wherein the replaceable top skin is configured to passively capture the one or more particles.

30. The system of claim 28, wherein the replaceable top skin is configured to actively capture the one or more particles via at least one of electrostatic attraction or mechanical trapping.

31. A method comprising:
    performing at least one chuck cleaning process to capture one or more particles on a chuck with a chuck cleaning sub-system including a plurality of lift pins, wherein the plurality of lift pins are driven by a power supply;
    transferring the captured one or more particles to a characterization sub-system; and
    analyzing the captured one or more particles with the characterization sub-system.

32. The method of claim 31, further comprising:
    determining a reduction in yield caused by the one or more particles on a chuck prior to the performing the at least one chuck cleaning process to capture the one or more particles from the chuck.

33. The method of claim 31, wherein the at least one chuck cleaning process comprises:
    receiving a cleaning substrate in a first position above a surface of the chuck with the plurality of lift pins;
    translating the cleaning substrate to a second position above the surface of the chuck from the first position via the plurality of lift pins, wherein the second position of the cleaning substrate is closer to the surface of the chuck than the first position of the cleaning substrate;
    capturing the one or more particles from the chuck by the cleaning substrate via at least one of electrostatic attraction or mechanical trapping when the cleaning substrate is in the second position; and translating the cleaning substrate to the first position after the capturing the one or more particles from the chuck by the cleaning substrate.

34. The method of claim 33, further comprising:
cleaning the cleaning substrate following the capturing the one or more particles from the chuck by the cleaning substrate and the analysis of the one or more particles.

35. The method of claim 31, wherein the at least one chuck cleaning process comprises:
removing a replaceable top skin from a chuck via a handling device, wherein the surface of the chuck is a portion of a replaceable top skin, wherein the replaceable top skin is configured to capture the one or more particles.

36. The method of claim 35, further comprising:
installing a second replaceable top skin on the chuck after the removal of the replaceable top skin with the captured one or more particles.

37. The method of claim 31, further comprising:
performing at least one pre-chuck cleaning process prior to the at least one chuck cleaning process.

38. The method of claim 37, where the at least one pre-chuck cleaning process includes a plasma or gas phase cleaning process.

39. The method of claim 31, further comprising:
generating diagnostic information based on the analysis of the captured one or more particles; and transmitting the diagnostic information to one or more fabrication sub-systems via a feed forward loop or a feedback loop.

* * * * *